United States Patent
Terakawa et al.

(10) Patent No.: US 9,955,595 B2
(45) Date of Patent: Apr. 24, 2018

(54) MOUNT BOARD TRAY AND ELECTRONIC DEVICE WITH MOUNT BOARD TRAY

(71) Applicants: Shogo Terakawa, Kanagawa (JP); Tetsuji Nishikawa, Kanagawa (JP); Kohta Takenaka, Kanagawa (JP); Hiroshi Ishii, Kanagawa (JP); Kouta Hirakawa, Tokyo (JP); Hidehiko Maeda, Tokyo (JP); Gaku Hosono, Kanagawa (JP)

(72) Inventors: Shogo Terakawa, Kanagawa (JP); Tetsuji Nishikawa, Kanagawa (JP); Kohta Takenaka, Kanagawa (JP); Hiroshi Ishii, Kanagawa (JP); Kouta Hirakawa, Tokyo (JP); Hidehiko Maeda, Tokyo (JP); Gaku Hosono, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/183,902

(22) Filed: Jun. 16, 2016

(65) Prior Publication Data
US 2016/0381815 A1  Dec. 29, 2016

(30) Foreign Application Priority Data

Jun. 23, 2015 (JP) ................................. 2015-125226

(51) Int. Cl.
| | |
|---|---|
| *H05K 7/02* | (2006.01) |
| *H05K 7/04* | (2006.01) |
| *H05K 5/00* | (2006.01) |
| *H05K 7/14* | (2006.01) |
| *G03G 15/00* | (2006.01) |

(52) U.S. Cl.
CPC ........... *H05K 5/0026* (2013.01); *G03G 15/80* (2013.01); *H05K 7/142* (2013.01); *H05K 7/1417* (2013.01)

(58) Field of Classification Search
CPC .... H05K 5/0026; H05K 7/1417; H05K 7/142; G03G 15/80
USPC ......................................... 361/807, 809, 810
See application file for complete search history.

(56) References Cited

U.S. PATENT DOCUMENTS 6,166,902 A * 12/2000 Liu ......................... G06F 1/181
361/679.58
6,721,177 B1 * 4/2004 Wang ................... G11B 33/128
248/638

(Continued)

FOREIGN PATENT DOCUMENTS

JP    61-200653    9/1986
JP    63-124497    5/1988

(Continued)

*Primary Examiner* — Hung S Bui
(74) *Attorney, Agent, or Firm* — Harness, Dickey & Pierce, P.L.C.

(57) ABSTRACT

A mount board tray is provided to hold multiple mount boards at different heights above and below the mount board tray. The mount board tray holds a topmost mount board placed at the topmost position among the multiple mount boards held by the mount board tray from below the topmost mount board. The mount board tray also holds a bottommost mount board placed at the bottommost position among the multiple mount boards from above the bottommost mount board at the same time.

17 Claims, 14 Drawing Sheets

(56) References Cited

U.S. PATENT DOCUMENTS

| | | | |
|---|---|---|---|
| 6,791,829 B1* | 9/2004 | Chen | G06F 1/184 361/679.33 |
| 6,819,562 B2* | 11/2004 | Boudreaux | H01L 23/4006 165/185 |
| 6,956,737 B2* | 10/2005 | Chen | G06F 1/184 312/223.1 |
| 7,031,152 B1* | 4/2006 | Tsai | G06F 1/184 312/223.2 |
| 7,092,249 B2* | 8/2006 | Wang | G06F 1/181 248/73 |
| 2010/0002366 A1* | 1/2010 | Pav | G06F 1/187 361/679.02 |
| 2011/0075358 A1* | 3/2011 | Fietz | G06F 1/185 361/679.58 |

FOREIGN PATENT DOCUMENTS

| | | |
|---|---|---|
| JP | 4-048564 | 2/1992 |
| JP | 9-293979 | 11/1997 |
| JP | 11-260494 | 9/1999 |
| JP | 2001-230561 | 8/2001 |
| JP | 2002-093995 | 3/2002 |

\* cited by examiner

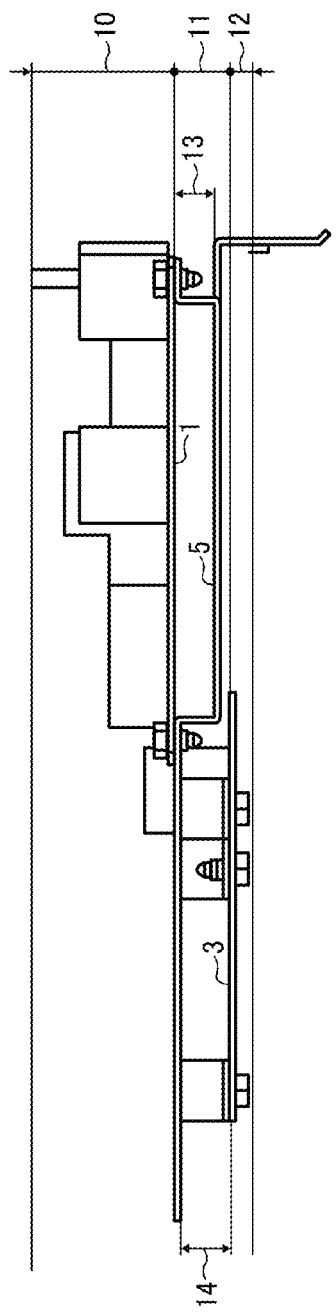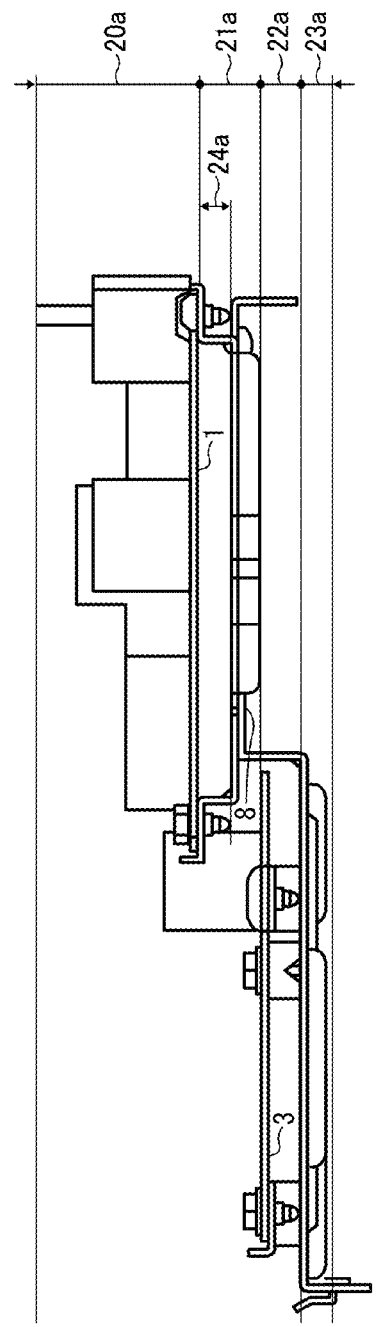

MOUNT BOARD TRAY AND ELECTRONIC DEVICE WITH MOUNT BOARD TRAY

CROSS-REFERENCE TO RELATED APPLICATION

This patent application is based on and claims priority pursuant to 35 U.S.C. § 119(a) to Japanese Patent Application No. 2015-125226 filed on Jun. 23, 2015 in the Japan Patent Office, the entire disclosure of which is hereby incorporated by reference herein.

BACKGROUND

Technical Field

Embodiments of the present invention relate to a mount board tray and an electronic device accommodating the mount board tray therein.

Related Art

In view of anti-noise, grounding, rigidity, and electric shock prevention requirements, a mount board is generally attached to an electronic device via a mount board tray. Since contact with the mount board tray and can cause a short-circuit therebetween, the mount board is usually spaced far enough apart from the mount board tray to prevent such short-circuiting. For the same reason, typically corners or unused regions of the mount board are used to fix the mount board onto the mount board tray using fasteners, such as screws, etc.

SUMMARY

One aspect of the present invention provides a novel mount board tray that holds multiple mount boards at different heights above and below the mount board tray. The mount board tray holds a topmost mount board placed at the topmost position among the multiple mount boards held by the mount board tray from below the topmost mount board. The mount board tray also holds a bottommost mount board placed at the bottommost position among the multiple mount boards from above the bottommost mount board at the same time.

Another aspect of the present invention provides a novel electronic device that includes a unit body and the above-described mount board tray. At least two mount boards are connected to each other in the unit body. Each of the at least two mount boards holds at least one surface mounted component thereon.

Yet another aspect of the present invention also provides a novel electronic device that includes a unit body having multiple tap holes at prescribed positions in the electronic device. A mount board tray is provided in the novel electronic device to hold a first mount board having a first vertical connector to be connected to a second vertical connector mounted on a second mount board mounted on another mount board tray in a connector engaging direction in the unit body. Each of the first mount board and the second mount board holds at least one surface mounted component on the respective first mount board and the second mount board. Multiple fastening holes are formed in the mount board tray to fasten and fix the mount board tray to the unit body with multiple fastening screws engaging with the multiple tap holes, respectively. Each of the multiple fastening holes has a larger diameter than a nominal diameter of each of the multiple fastening screws. A fastening direction of each of the multiple fastening screws is substantially the same as the connector engaging direction. Either the unit body includes multiple spring elements to form the multiple tap holes therein, respectively, or the mount board tray includes multiple spring elements to form the multiple fastening holes therein, respectively. The multiple spring elements are deformable in the connector engaging direction.

BRIEF DESCRIPTION OF THE DRAWINGS

A more complete appreciation of the present invention and many of the attendant advantages thereof will be more readily obtained as substantially the same becomes better understood by reference to the following detailed description when considered in connection with the accompanying drawings, wherein:

FIG. 5 is a front elevational view illustrating an exemplary layout and gaps of a mount board tray downsized based on its shape according to the first embodiment of the present invention;

FIG. 6 is also a front devotional view illustrating a layout and gaps of a common mount board tray to be compared with the mount board tray of FIG. 5;

DETAILED DESCRIPTION

Figure 1A:
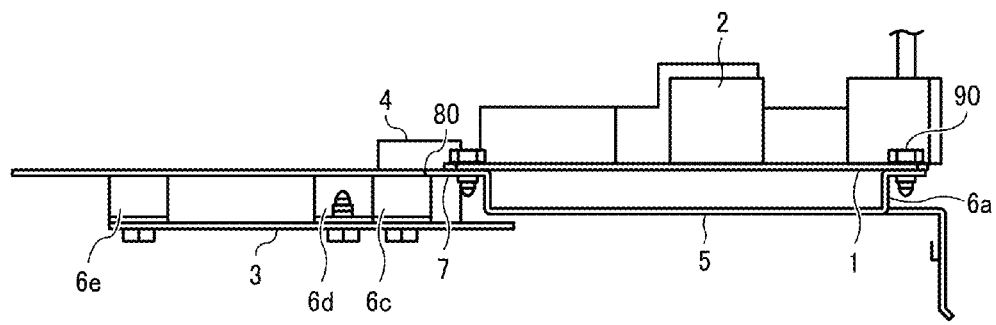
FIG. 1A is a cross-sectional view illustrating an exemplary configuration of a mount board and a mount board tray according to a first embodiment of the present invention.

In general, due to a restriction on a layout, the multiple mount boards are sometimes three-dimensionally separated from each other, for example, when the multiple mount boards are connected to each other via a connector and when one of these mount boards holds a switch thereon to be operated by an operator and is accordingly located near an exterior cover of an electronic device or a similar situation.

In one attempt, to install more than two mount boards in a necessary minimum space of the electronic device and accordingly downsize the electronic device, multiple mount board trays each having a prescribed shape capable of mutually fitting to each other while holding only one mount board thereon are employed. That is, the prescribed number of mount board trays is connected to each other and is collectively installed in the electronic device corresponding to the required number of the mount boards.

In general, since relative positions of the male and female side connectors collectively forming a connector are determined at a connector fitting section, at which the male and female side connectors are connected to each other to supply electricity to the electronic device, a fitting hole having a larger diameter than an exterior shape of the male and female side connectors (i.e., the connector) is typically formed in a unit body to loosely hold and then coaxially adjust axes of these male and female side connectors with each other, respectively. To absorb misalignments of the male and female side connectors in a connector fitting direction, in which the male and female side connectors (i.e., the connector) are connected to each other, a spring member, such as a coil spring, a spring washer, etc., is generally employed. That is, the spring member of the coil spring or the spring washer and a prescribed structure loosely hold the male and female side connectors near the connector fitting section to allow the male and female side connectors to move in three axial directions thereby absorbing and preventing the misalignment of these male and female side connectors. In such a situation, these male and female side connectors are generally pressed and fixed only by the coil spring.

Now, various embodiments of the present invention are herein below described first roughly and then in detail with reference to several drawings. That is, the present invention relates to a mount board tray having the following features. That is, the mount board tray attaches multiple mount boards each placed at a different height above the other to an interior of an electronic device, simultaneously. That is, the mount board tray holds and fixes a topmost mount board from below the topmost mount board via a mount board holding cut and bent projection (i.e., a mount board holding part). The mount board tray also holds and fixes a bottommost mount board from above the bottommost mount board via a mount board holding cut and bent projection again at the same time. With this, a distance between the mount board and the mount board tray can be sufficiently kept to avoid a short-circuit while downsizing an overall configuration for holding the multiple mount boards. In other words, to attach multiple mount boards each placed at the different height to the electronic device at the same time, the mount board tray fixes the topmost mount board from below the topmost mount board with the mount board holding cut and bent projection and the bottommost mount board from above the bottommost mount board with the mount board holding cut and bent projection, so that the distance between the mount board and the mount board tray can be sufficiently kept to avoid the short-circuit therebetween while downsizing the overall configuration for holding the mount boards thereon.

Figure 1B:
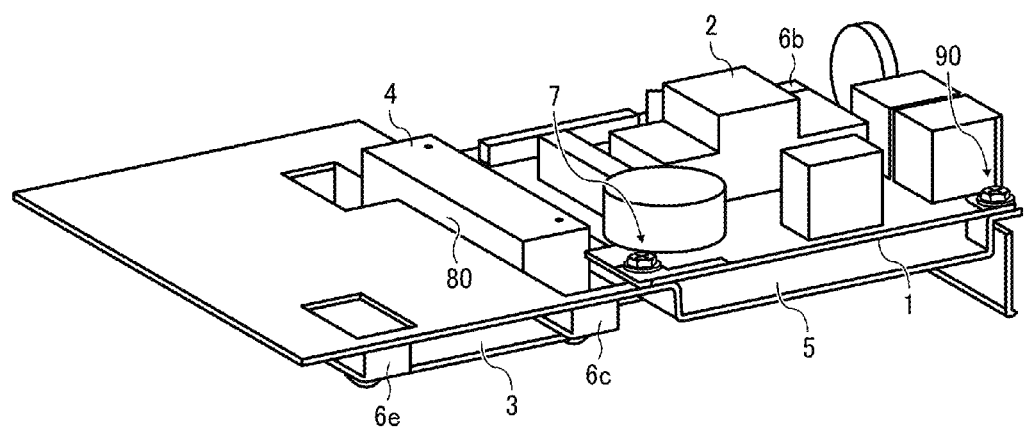
FIG. 1B is a perspective view illustrating the exemplary configuration of a mount board and a mount board tray of FIG. 1A.

Referring now to the drawings, wherein like reference numerals designate identical or corresponding member throughout the multiple views thereof, and in particular to FIGS. 1A and 1B and applicable drawings, features of the mount board tray according to various embodiments of the present invention are described.

Figure 2A:
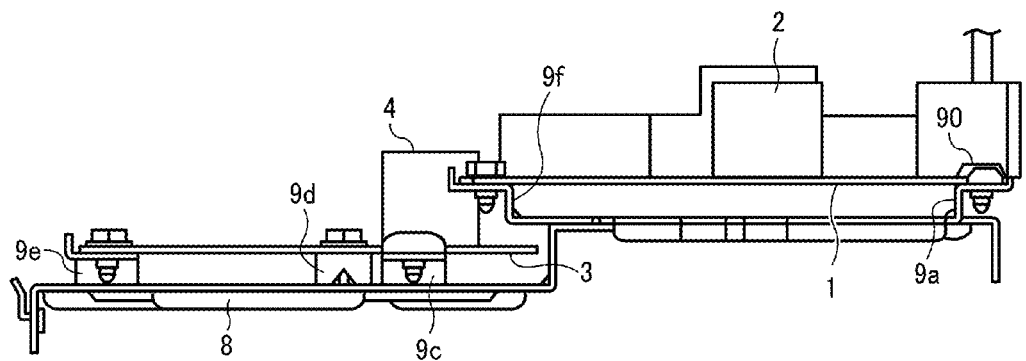
FIG. 2A is a cross-sectional view illustrating a comparative example of a construction of a mount board and a mount board tray.
Figure 2B:
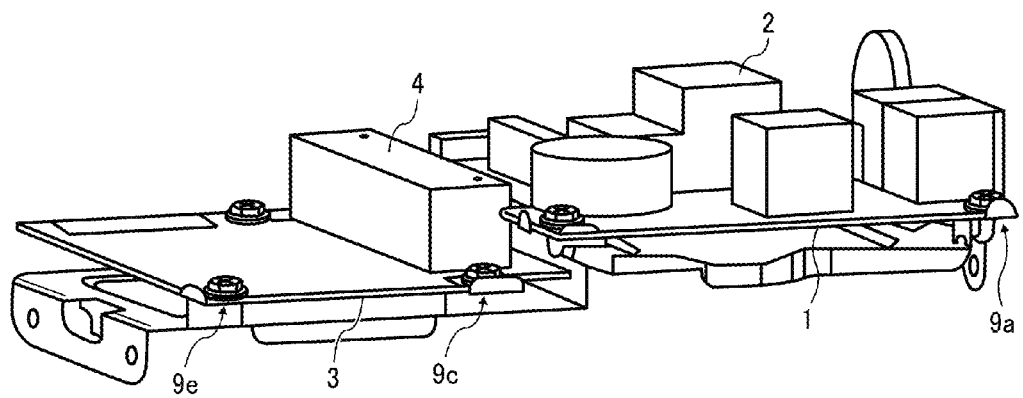
FIG. 2B is also a perspective view illustrating the comparative example of a construction of a mount board and a mount board tray of FIG. 2A.
Figure 3A:
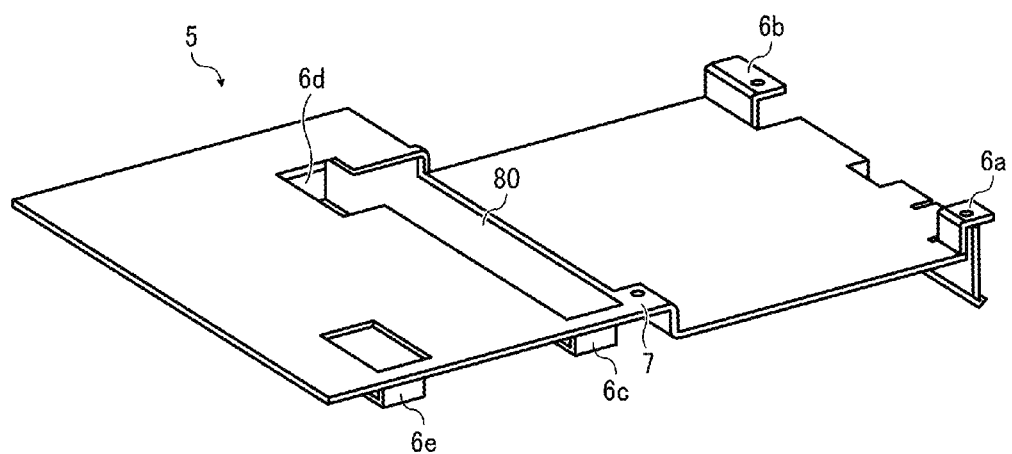
FIG. 3A is a perspective view illustrating an exemplary mount board tray taken from above the mount board tray according to the first embodiment of the present invention.
Figure 3B:
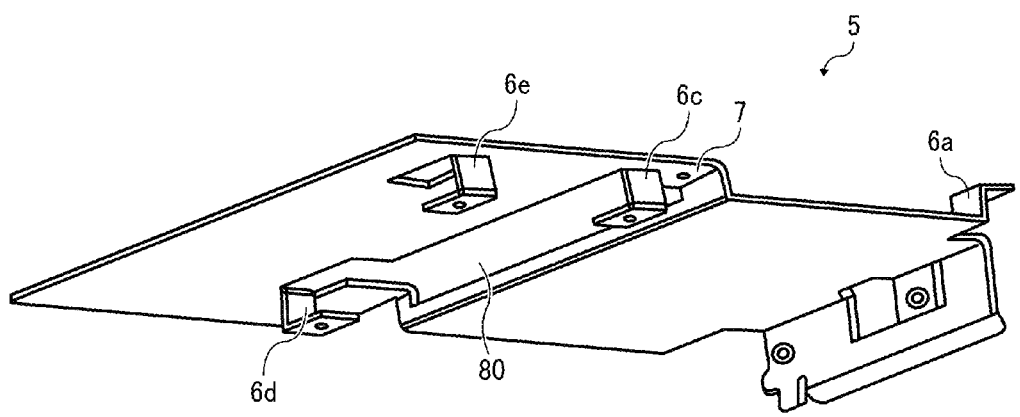
FIG. 3B is also a perspective view illustrating the exemplary mount board tray of FIG. 3A taken from below the mount board tray.
Figure 4:
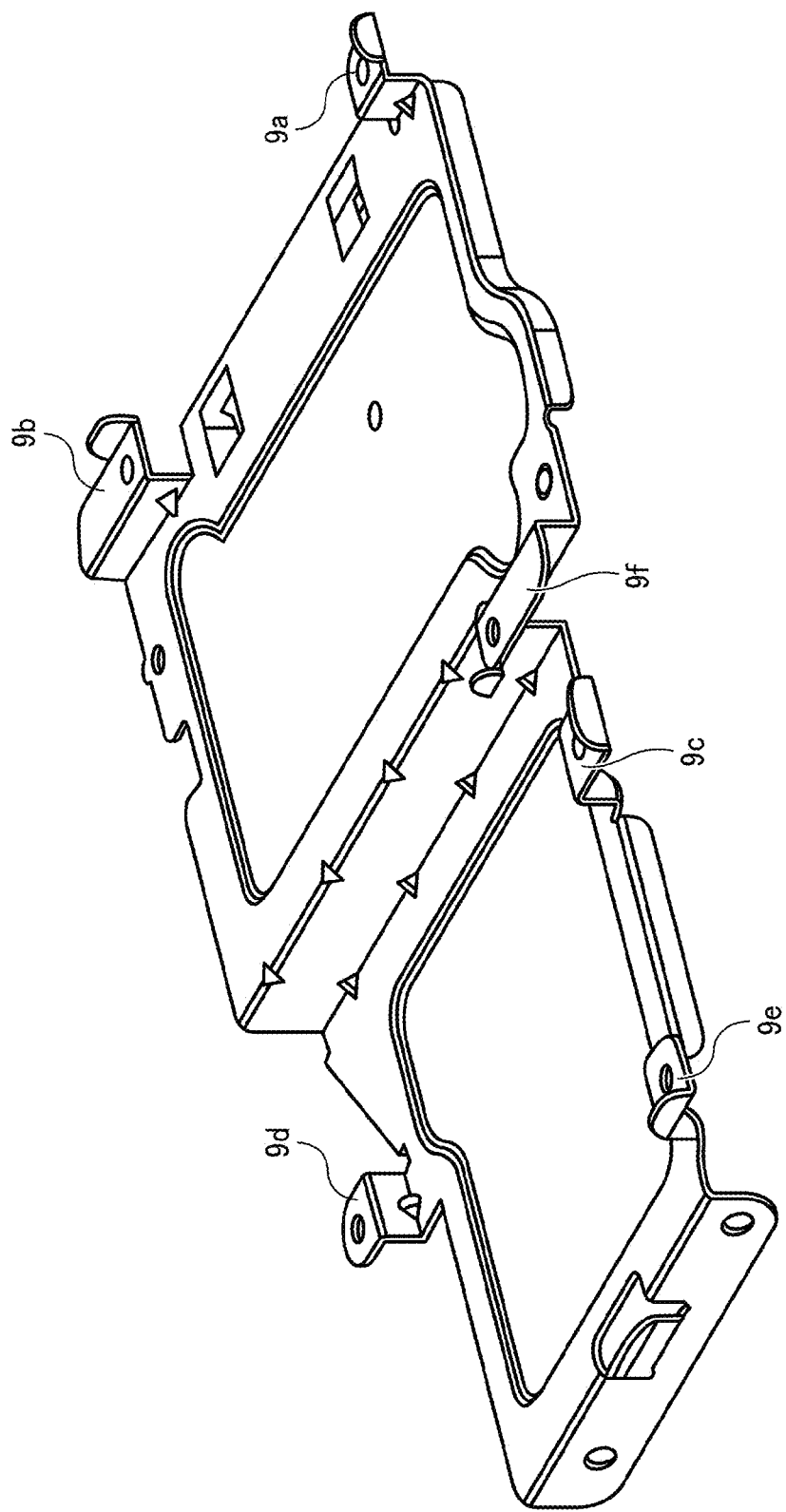
FIG. 4 is a perspective view illustrating a common example of a mount board tray.

That is, as shown in FIGS. 1A and 1B, an exemplary configuration of a mount board and a mount board tray are collectively illustrated. FIGS. 2A and 2B are front devotional and perspective views collectively illustrating a comparative and general configuration of a mount board and a mount board tray, respectively. An exemplary mount board tray according to one embodiment of the present invention is again collectively illustrated in FIGS. 3A and 3B. A common mount board tray is also shown in FIG. 4.

Now, a first embodiment of the present invention is described with reference back to FIGS. 1A and 1B and applicable drawings. As shown in FIG. 1A, multiple mount boards 1 and 3 are connected to each other via a connector 4, and accordingly relative positions of the mount boards 1 and 3 are determined in this embodiment of the present invention. As shown, multiple surface mounted components 2 are mostly placed on an upper surface of the mount board 1. As an exemplary system of holding the mount board 1, multiple mount board holding cut and bent projections 6a and 6b and a mount board holding section 7 are provided on a mount board tray 5 and are brought in contact with non-implementation portions of a lower side of the mount board 1, respectively. Then, multiple fasteners 90 fasten the mount board 1 to the mount board tray 5 (i.e., the multiple mount board holding out and bent projections 6a and 6b and the mount board holding section 7) from above the mount board 1, for example. Thus, as shown in FIGS. 3A and 3B, these mount board holding cut and bent projections 6a and 6b and the mount board holding section 7 include common fastening holes therein to receive the multiple fasteners 90, respectively.

Figure 3C:
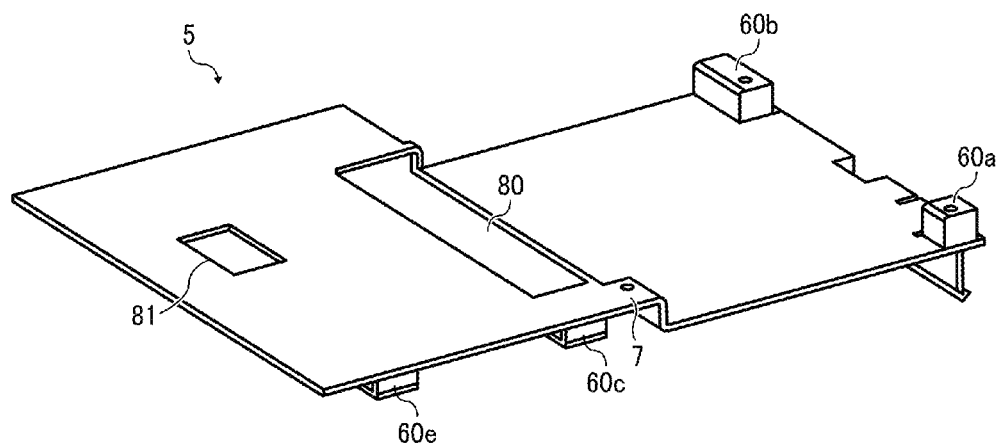
FIG. 3C is a perspective view illustrating an exemplary modification of the mount board tray of FIG. 3A taken from above the modified mount board tray according to the first embodiment of the present invention.
Figure 3D:
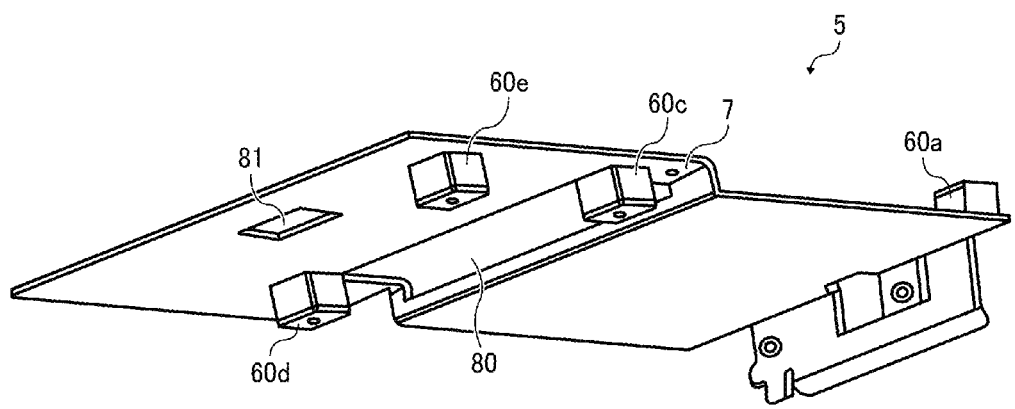
FIG. 3D is a perspective view illustrating an exemplary modification of the mount board tray of FIG. 3A taken from below the modified mount board tray according to the first embodiment of the present invention.

As an alternative fixing system, as shown in FIGS. 3C and 3D, the mount board tray 5 and the mount board 1 may be fixed to each other by using fasteners via spacers (60a and 60b) and instead of the above-described mount board holding cut and bent projections 6a and 6b and the fasteners. That is, the mount board 1 may be screwed to the mount board tray 5 from above the mount board 1 via the spacers (60a and 60b), for example. Again, as shown in FIGS. 3C and 3D, these the spacers (60a and 60b) include common fastening holes therein to receive the multiple fasteners 90, respectively.

Although those are omitted again from the drawings, in a soldering surface of the rear side of the mount board 1, there are generally provided cutting edges of lead wires of various components, respectively. Accordingly, to prevent contact and thereby avoid a short-circuit between the mount board 1 and the mount board tray 5 even when either the mount board 1 or the mount board tray 5 vibrates or deforms, a gap of about a few millimeters, for example, about 7 mm, is created between these mount board 1 and the mount board tray 5.

Further, as shown in FIG. 1A, the mount board tray 5 has a step almost at its lateral center and a left side of the step is placed above the mount board 3. As shown in FIG. 1B, a cutaway connector opening 80 is formed almost at the lateral center of the mount board tray 5 to prevent the mount board tray 5 from positional interference with a connector 4. As an exemplary system of holding the mount board 3, multiple mount board holding cut and bent projections 6c, 6d, and 6e are provided in the mount board tray 5 and are brought in contact with the non-implementation portions of the lower side of the mount board 3, respectively. Then, multiple fasteners 90 are used to collectively fix the mount board 3 onto the mount board tray 5 from the lower side of the mount board 3, for example. These mount board holding cut and bent projections 6a, 6b, 6c, and 6e include fastening holes therein to receive the fasteners to collectively fasten the mount boards 1 and 3 to the mount board tray, respectively. As an alternative fixing system, as shown in FIGS. 3C and 3D, the mount board tray 5 and the mount board 3 can be fixed to each other by using spacers (60c to 60e) and fasteners instead of the mount board holding cut and bent projections (6c to 6e) and the fasteners as used in the alternative fixing system for the mount board 1. That is, the mount board 3 may be screwed to the mount board tray 5 from below the mount board 3 via the spacers (60c to 60e), for example. Hence, the mount board tray 5 holds the multiple mount boards 1 and 3 at the same time each placed at a different height above the other. That is, the mount board tray 5 holds the mount board 1 placed at the topmost position from below the topmost mount board, and holds the mount board 3 placed at the bottommost position from above the mount board 3.

As described heretofore as one example of the present invention, the multiple mount boards 1 and 3 are disposed at the different height form each other and are connected to each other via the connector 4. However, the present invention is not limited thereto, and is also applicable to various modifications, for example when multiple mount boards are three-dimensionally disposed due to a layout restriction.

Further, as shown in FIGS. 1A and 1B, the mount board 3 in this embodiment of the present invention acts as a relay mount board that connects the mount board 1 with yet another mount board (omitted from the drawings for the purpose of simplicity but) installed in the electronic device. That is, any parts are not implemented on the mount board 3 except for the connector 4 as shown. However, in this embodiment of the present invention, when some parts are similarly implemented on the mount board 3 in addition to the connector 4 in such a narrow space, to avoid interfere with these parts, as shown in FIGS. 3C and 3D, a cutaway components opening 81 or the like is similarly formed again in the upper stepped surface of the mount board tray 5 at a portion above these parts as formed almost at the lateral center of the mount board tray 5. Thus, the parts can be fixed without interfering with the upper stepped surface of the mount board 3 as well.

Now, a comparative example is herein below described with reference to FIGS. 2A and 2B. That is, a configuration of a typical mount board tray is illustrated in the drawings. When more than two mount boards are held at the same time, a mount board tray is placed beneath the than two or more mount boards via a constant gap from a rear side of each of these mount boards. In addition, multiple mount board holding cut and bent projections 9a, 9b, 9c, 9d, 9e, and 9f are formed all extending in the same direction from the mount board tray toward the rear sides of the respective mount boards to hold these mount boards.

Now an exemplary principle of downsizing the mount board tray according to the first embodiment of the present invention is described with reference to FIGS. 5 and 6. That is, FIG. 5 illustrates an exemplary layout of the mount board tray, the mount boards, and gaps formed therebetween according to the first embodiment of the present invention. FIG. 6 also illustrates a configuration of a common layout of the mount board tray, the mount boards, and gaps formed therebetween. As shown in FIG. 5, in the layout according to the first embodiment of the present invention, a structure of the mount board tray and the mount boards is divided into three regions of an implementation region 10 for mounting surface mounted components on the mount board 1, a distance 11 between the mount boards 1 and 3, and a gap 12 between the mount board 3 and parts (omitted from the drawings for the purpose of simplicity) placed beneath the mount board 3. As shown, a gap 13 between the mount board 1 and the mount board tray 5 and a gap 14 between the mount board 3 and the mount board tray 5 are included in the distance 11. By contrast, in the layout of the common configuration as shown in FIG. 6, the above-described structure of the mount board tray and the mount boards is divided into four regions of an implementation region 20a for mounting surface mounted components on the mount board 1, a distance 21a between the mount boards 1 and 3, a gap 22a between the mount board 3 and the mount board tray 8, and a gap 23a between the mount board tray 8 and parts (omitted again from the drawings for the purpose of simplicity) placed beneath the mount board tray 8. A gap 24a between the mount board 1 and the mount board tray 8 is included in the distance 21a.

When the above-described layouts of the first embodiment of the present invention and the common configuration are compared, since the mount board tray 8 is placed below the lower mount board 3 in the common configuration, the gap 22a and cut and bent projections of the mount board tray 8 occupy a space extending below the mount board 3. By contrast, however, in the layout of the first embodiment of the present invention, the mount board tray 8 is placed within the distance 11 between the mount boards 1 and 3, so that the gap 14 between the mount board 3 and the mount board tray 5 falls within the distance 11. For this reason, a space is only needed below the mount board 3 for the gap 12, and accordingly the entire configuration can be minimized in this embodiment of the present invention.

Figure 7A:
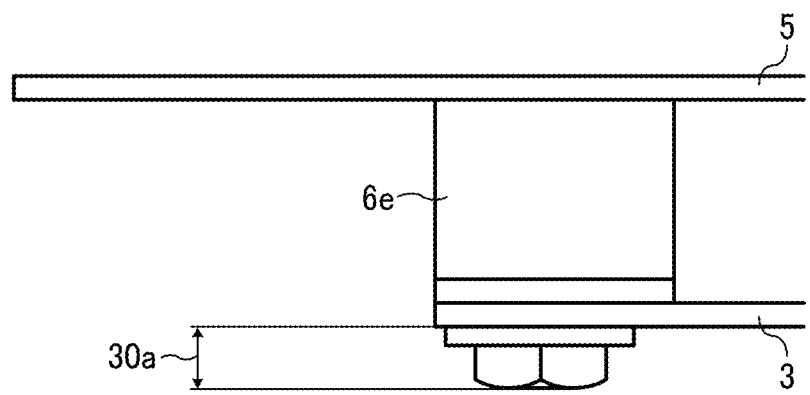
FIG. 7A is a front elevational view partially illustrating an exemplary configuration of a mount board tray downsized by fastening a mount board to the mount board tray with a fastener from below the mount board according to the first embodiment of the present invention.
Figure 7B:
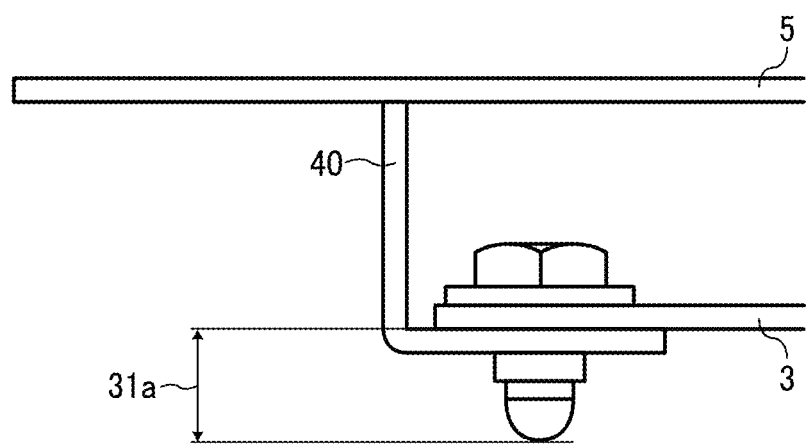
FIG. 7B is also a front elevational view partially illustrating a comparative example of a mount board tray to which a mount board is fastened with a fastener from above the mount board by contrast to the exemplary configuration of a mount board tray of FIG. 7A.

Now, an exemplary fastening system of fastening the mount board to the mount board tray capable of downsizing the above-described configuration is herein below described with reference to FIGS. 7A and 7B. That is, FIG. 7A is a front elevational view illustrating an exemplary fastening system of fastening the mount board to the mount board tray with a fastener from below the mount board to downsize the above-described configuration according to the first embodiment of the present invention. FIG. 7B is also a front devotional view illustrating a comparative fastening system of fastening the mount board to the mount board tray with the fastener from above the mount board to be compared with this embodiment of the present invention. Now, as a fastening section of this embodiment of the present invention, the mount board holding cut and bent projection 6e downwardly extending from the mount board tray 5 as shown in FIG. 3B is herein below typically described in greater detail. That is, as shown in FIG. 7A, in the first embodiment of the present invention, the mount board holding cut and bent projection 6e contacts the non-implementation region of an upper side of the mount board 3. The mount board 3 is then fastened to the mount board holding cut and bent projection 6e with a fastener from below the mount board 3 and the mount board holding cut and bent projection 6e as well. Accordingly, when a common screw is used as the fastener, a dimension of a region 30a to occupy a lower side of the mount board 3 almost corresponds to a height of a head of the common screw, and is generally about 2 mm. By contrast, as shown in FIG. 7B, the mount board holding cut and bent projection 40 also contacts a non-implementation portion of a lower side of the mount board 3 and the mount board 3 is fastened to the mount board holding cut and bent projection 40 with the common screw again from above the mount board 3 and the mount board holding cut and bent projection 40 as well. Accordingly, a dimension of the region 31a to occupy the lower side of the mount board 3 almost corresponds to a difference between a nominal length of the common screw and a thickness of the mount board 3. Consequently, the region 31a to occupy the lower side of the mount board 3 is generally wider than the region 30a of FIG. 7A. In this way, according to the first embodiment of the present invention, when the common screw is employed as the fastener, since the head of the screw can be placed outside of a fastening configuration, the above-described fastening system of the first embodiment of the present invention is advantageous to downsizing the system.

Figure 8A:
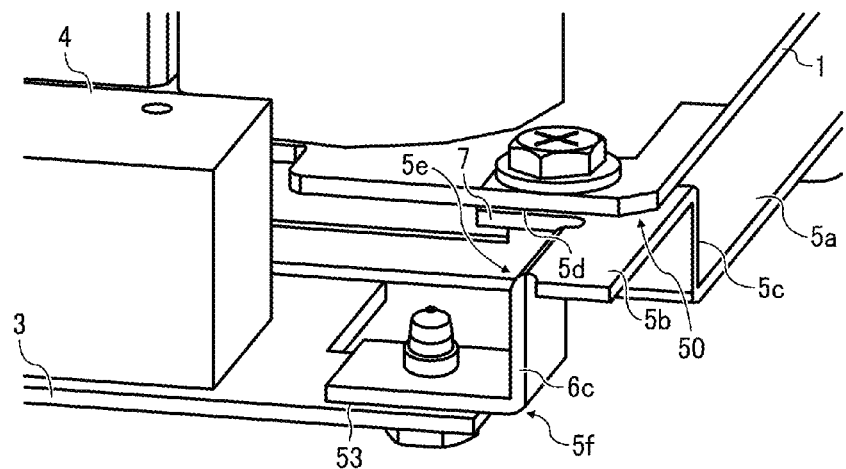
FIG. 8A is also a perspective view illustrating an exemplary connection condition of a connector connected to a mount board tray according to the first embodiment of the present invention.
Figure 8B:
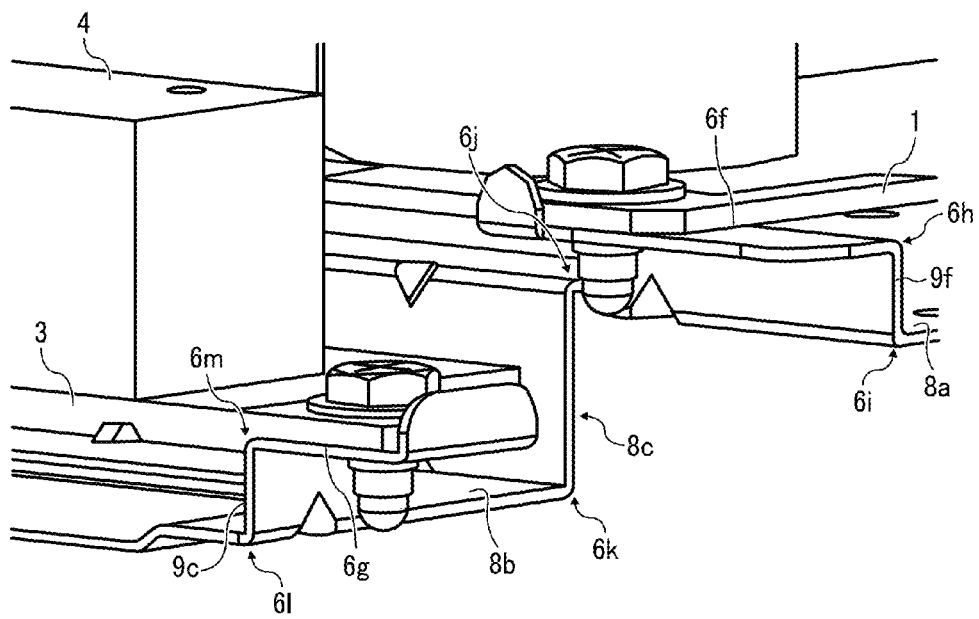
FIG. 8B is also a perspective view illustrating a typical connection condition of a connector connected to a mount board tray to be compared with illustrating a portion of a common mount board tray near a connector connected thereto to be compared with the exemplary connection condition of FIG. 8A.

Now, an exemplary configuration capable of improving connection precision of the connector 4 that connects the multiple mount boards 1 and 3 to each other is herein below described in detail with reference to FIGS. 8A and 8B. That is, FIG. 8A is a perspective view illustrating a portion near an exemplary connector to indicate connection performance of the connector according to one embodiment of the present invention. FIG. 8B is also a perspective view illustrating a portion near a connector having a general configuration to indicate connection performance of the connector to be compared with this embodiment of the present invention. As shown in FIG. 8A, the mount board tray 5 has a step composed of a lower stepped surface 5a, an upper stepped surface 5b, and a rise (i.e. a linkage of surfaces) 5c connecting these lower and upper stepped surfaces 5a and 5b to each other. The mount board holding section 7 holding the mount board 1 near the connector 4 is also formed in a portion of the upper stepped surface 5b. The mount board holding cut and bent projection 6c is formed downwardly extending from the upper stepped surface 5b to contact and hold the mount board 3. Accordingly, between a contact surface 5d of the mount board holding section 7 contacting the mount board 1 and the contact surface 53 of the mount board holding cut and bent projection 6c contacting the mount board 3, there are provided two bending portions 5e and 5f in the mount board tray 5. By contrast, in the common configuration as shown in FIG. 8B, the mount board tray 8 is composed of an upper stepped surface 8a, a lower stepped surface 8b, and a rise (i.e., a linkage of surfaces) 8c connecting these upper and lower stepped surfaces 8a and 8b to each other. A mount board holding cut and bent projection 9f is formed upwardly extending from the upper stepped surface 8a of the mount board tray 8 to contact and hold the mount board 1 located near the connector 4. In addition, a mount board holding cut and bent projection 9c is formed upwardly extending from the lower stepped surface 8b of the mount board tray 8 to contact and hold the mount board 3 as well. Hence, between a contact surface 6f of the mount board 1 contacting the mount board holding cut and bent projection 9f and a contact surface 6g of the mount board 3 contacting a mount board holding cut and bent projection 9c, there are provided six bending portions 6h to 6m as shown. In view of this, in the mount board tray of this embodiment of the present invention, the number of bending portions intervening between the mount boards 1 and 3 connected to each other by the connector 4 is less than that in the common configuration. Since a construction having fewer bending portions as in the above-described configuration of FIG. 7A is generally advantageous in terms of dimensional precision thereof, the mount board tray 5 of this embodiment of the present invention can advantageously rarely raise a problem, such as damage, defective electrical conduction, etc., generally caused at the connecting section or by the connector 4 itself when the mount boards 1 and 3 are misaligned with each other due to a variation in dimension of the mount board tray 5.

As described heretofore, according to one embodiment of the present invention, a sufficient distance (i.e., a sufficient gap) can be provided between each of the multiple mount boards and the mount board tray to avoid the short-circuit while downsizing the overall configuration for holding the multiple mount boards. Further, when the screw is used as the fastener to fasten the mount board to the mount board holding cut and bent projection, since the head of the screw is placed outside the fastening configuration of the mount board and the mount board holding cut and bent projection, the overall mount board tray configuration can be more effectively downsized than the configuration in which of a tip (i.e., an opposite side of the head) of the screw is placed outside the fastening configuration. Further, since the number of bending portions between two mount boards as connection targets decreases, the configuration of the mount board tray is advantageous in terms of dimensional precision thereof. That is, the problem, such as damage, defective electrical conduction, etc., generally caused at the connecting section or the connector itself when the multiple mount boards are misaligned and accordingly forcibly connected to each other via the connector due to a variation in dimension of the mount board tray or the like, is rarely raised.

Now, a second embodiment of the present invention is herein below initially described roughly and in greater detail later with reference to FIGS. 9 to 14 and applicable drawings. That is, in short, in the second embodiment of the present invention, a mount board tray holds a connector thereon and is fixed to a unit body together with the connector. For this purpose, several fastening holes are provided in the mount board tray in order to fasten the mount board tray to the unit body with screws, respectively. All of these multiple fastening holes are composed of loosely fitting holes each having a larger diameter than that of the fastening screw, respectively. In addition, each of a fastening direction of these multiple fastening holes is coaxial with the connector engaging direction as well. In a fastening section of either the unit body or the mount board tray, an elastic body is provided to deform in the connector engaging direction. Hence, the mount board can be fixed to and the unit body e via the mount board tray while aligning central axes of male and female side connectors with each other in the advantageously simplified and downsized configuration.

In addition, even when engaging directions of the male and female side connectors interfere with each other, and accordingly a fitting error of these connectors generally occurs due to dimensional variations of those, damage and defective electrical conduction can be prevented. That is, the elastic body deforms and thereby absorbs misalignment (i.e., the fitting error) therebetween.

Further, since the mount board tray and the unit body are fastened to each other with the screws, a problem of misalignment within a range of the fitting hole, generally caused by vibration and/or an impact, is hardly raised.

Figure 9:
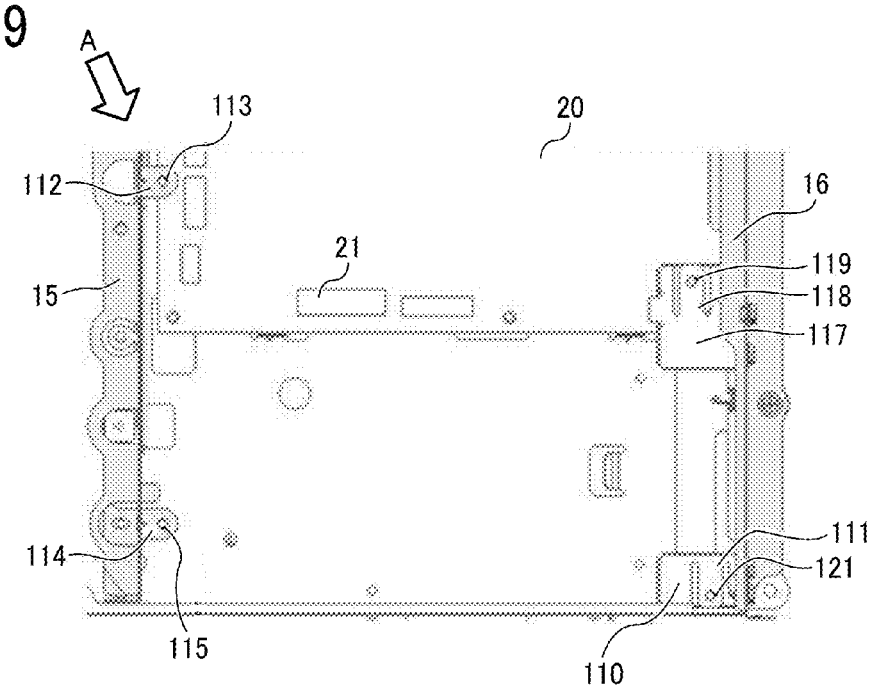
FIG. 9 is a plan view illustrating an exemplary configuration of a unit body according to a second embodiment of the present invention.
Figure 10:
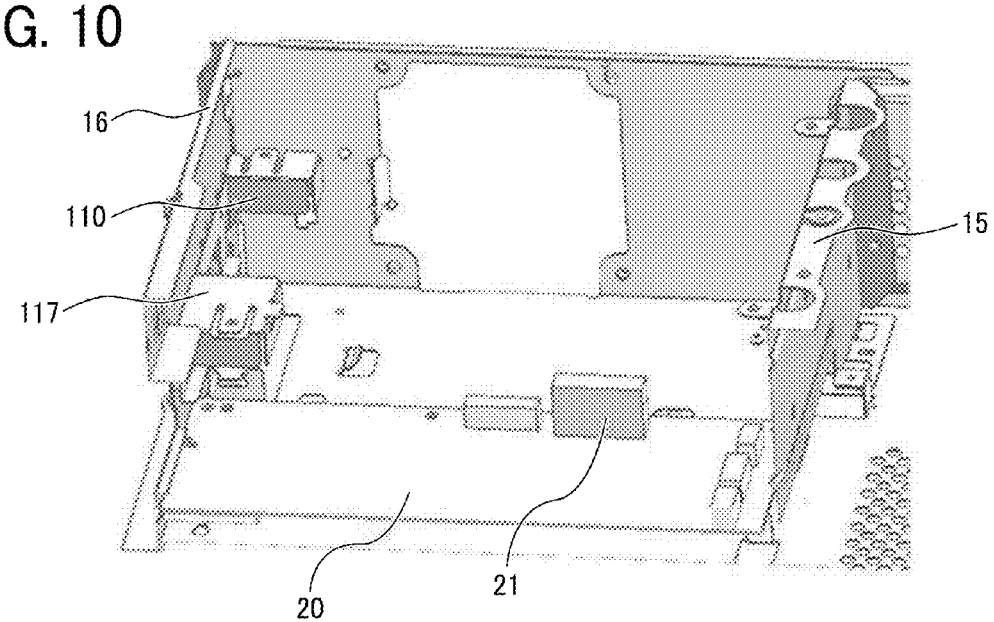
FIG. 10 is a perspective view illustrating the unit body of FIG. 9, which is taken from a point as shown by arrow A in FIG. 9.

Now, the second embodiment of the present invention as roughly described above is herein below described in greater detail with reference to FIGS. 9 and 10 and applicable drawings again. As described earlier, FIGS. 9 and 10 are diagrams collectively illustrating the exemplary configuration of the unit body according to the second embodiment of the present invention. More specifically, FIG. 9 is the plan view illustrating the exemplary configuration of the unit body. Whereas, FIG. 10 is the perspective view illustrating the exemplary configuration of the unit body taken from the point A as shown in FIG. 9 as well. As shown there, to the unit body as indicated by the hatching pattern, the left side frame 15 and the right side frame 16 are attached. The mount board 20 is also attached to the unit body as well. There is provided a connector 21 in the mount board 20 to electrically connect with the other mount board (omitted from the drawings for the purpose of simplicity), for example, placed above the mount board 20. In the left side frame 15, multiple plate springs 112 and 114 with tap holes 113 and 115, respectively, are provided as well. To the right side frame 16, a pair of mounting bases 117 and 110 is attached. To the mounting base 117, a plate spring 118 with a tap hole 119 therein is attached. Similarly, to the mounting base 110, a plate spring 111 with a tap hole 121 therein is also attached as well.

Figure 11:
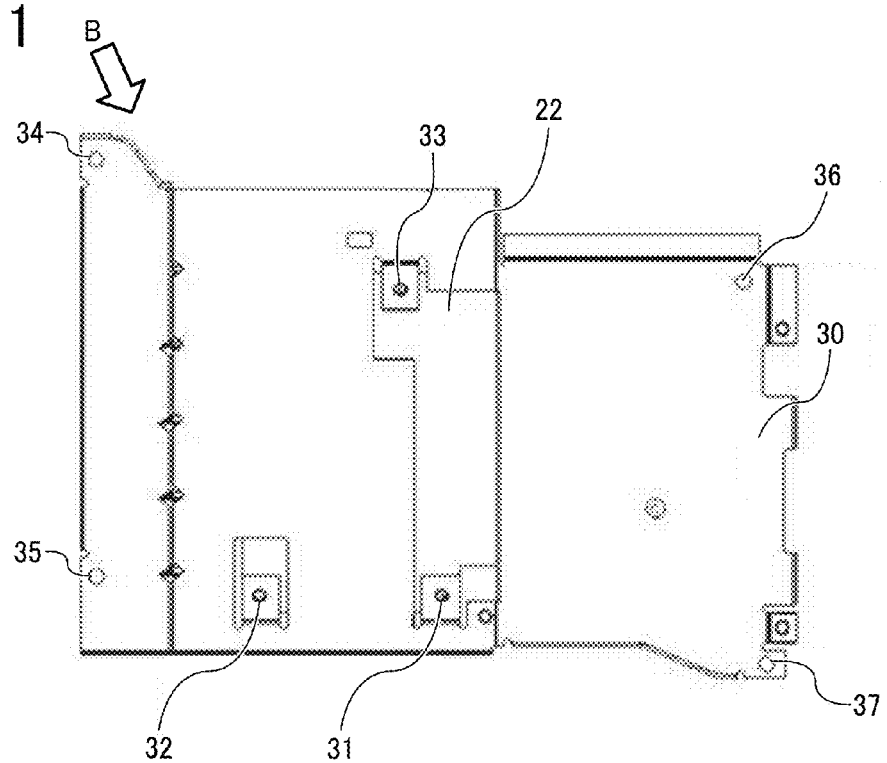
FIG. 11 is a plan view illustrating an exemplary configuration of a mount board tray and a mount board according to a second embodiment of the present invention.
Figure 12:
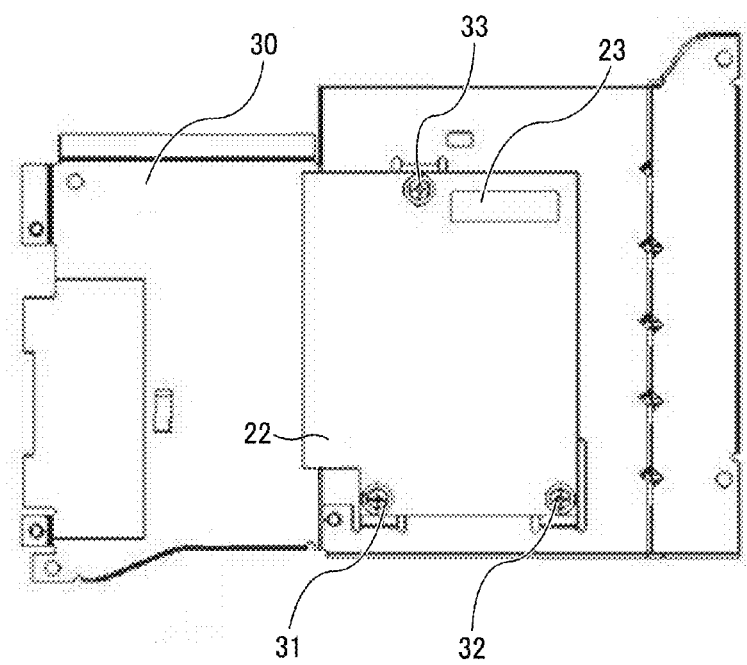
FIG. 12 is a bottom view also illustrating the configuration of the mount board tray and the mount board of FIG. 11.

Now an exemplary configuration of the mount board tray and the mount board according to the second embodiment of the present invention is herein below described in greater detail with reference to FIGS. 11 to 14. That is, FIGS. 11 to 14 are drawings collectively illustrating exemplary configurations of the mount board tray and the mount board of the second embodiment of the present invention. More specifically, FIG. 11 is a plan view illustrating the exemplary configuration of the mount board tray and the mount board of this embodiment of the present invention. Whereas, FIG. 12 is a bottom view illustrating the exemplary configuration of the mount board tray and the mount board as shown in FIG. 11, which is taken from a bottom side of the mount board tray and the mount board shown in FIG. 11.

Figure 13:
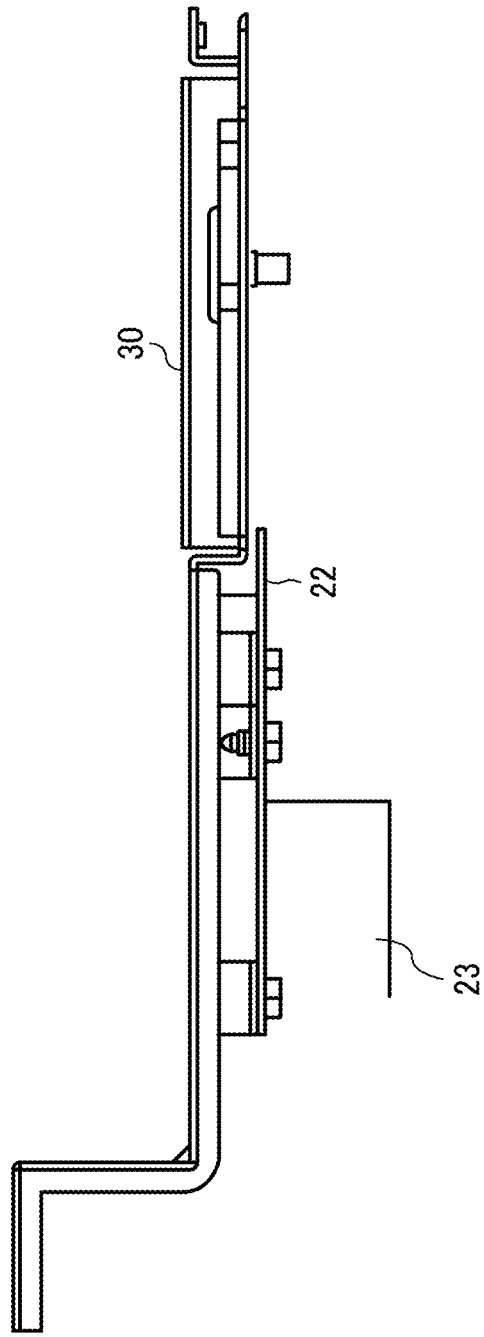
FIG. 13 is a side view also illustrating the configuration of the mount board tray and the mount board of FIG. 11.
Figure 14:
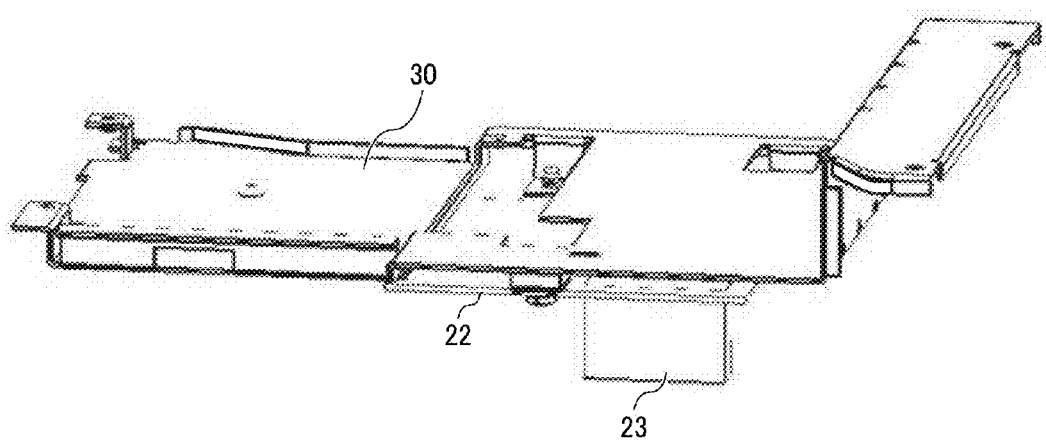
FIG. 14 is a perspective view further illustrating the configuration of the mount board tray and the mount board of FIG. 11, which is taken from a point as shown by arrow B in FIG. 11.

FIG. 13 is a side view illustrating the exemplary configuration of the mount board tray and the mount board as shown in FIG. 11, which is taken from one side of the mount board tray and the mount board. FIG. 14 is a perspective view illustrating the exemplary configuration of the mount board tray and the mount board as shown in FIG. 11, which is taken from the point A as shown by an arrow in FIG. 11. As collectively shown in the above-described drawings, in this embodiment of the present invention, the mount board tray 30 holds a mount board 22 by fastening it wat multiple fastening sections 31, 32, and 33 as shown in FIGS. 11 and 12. As shown in FIG. 12, a connector 23 is provided in the mount board 22 to engage with a connector 21 thereby electrically connecting with a mount board 20 (see FIG. 10). As shown in FIG. 11, in the mount board tray 30, four fastening holes 34, 35, 36, and 37 are formed to collectively fasten the mount board tray 30 to the unit body with fastening screws in association with four tap holes 113, 115, 119, and 121 formed in the unit body, respectively. All of these fastening holes 34 to 37 are composed of loosely fitting holes, respectively, and each of these fastening holes 34 to 37 has a larger diameter than a nominal diameter of the fastening screw again.

As described heretofore, according to the second embodiment of the present invention, since the mount board can be secured to the unit body while making the central axes of the male and female side connectors coincide with each other, damage and defective electrical conduction, generally caused when misalignment of the male and female side connectors occur thereby generating a fitting error, can be prevented with a simple and compact configuration. Further, even when the connector engaging directions interfere with each other (i.e., deviate from each other), since the elastic body deforms and accordingly the mount board tray is appropriately displaced in the same direction, misalignment thereof can be tolerated. At the same time, even when a load is applied onto the male and female side connectors, damage of the male and female side connectors and the mount board can be substantially prevented or minimized as well.

Figure 15:
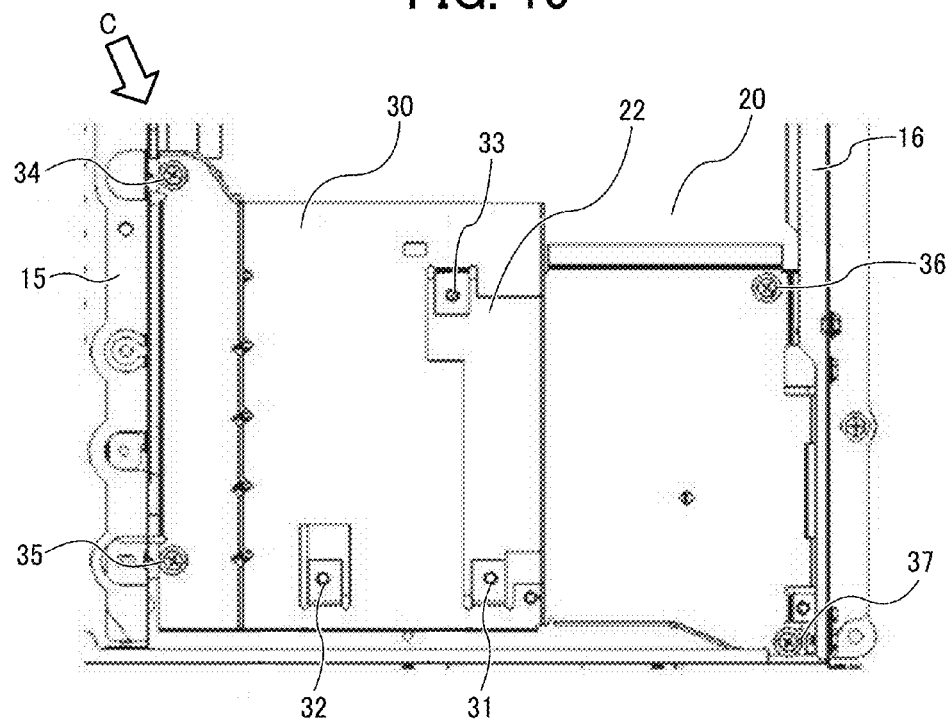
FIG. 15 is a plan view illustrating an exemplary configuration of an electronic device according to a third embodiment of the present invention.
Figure 16:
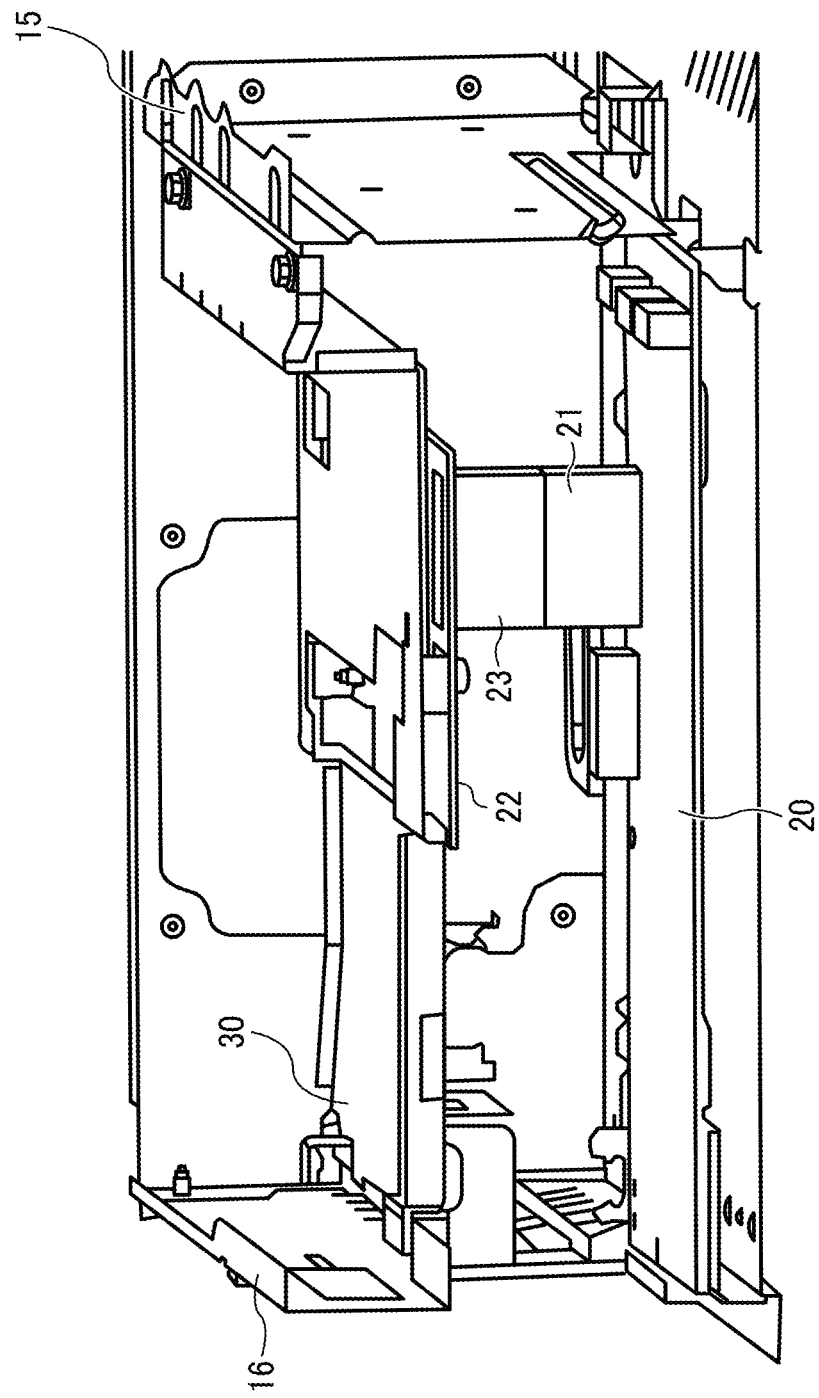
FIG. 16 is a perspective view illustrating the configuration of the electronic device of FIG. 15, which is taken from a point as shown by arrow C in FIG. 15.

Now, a third embodiment of the present invention is herein below described in detail with reference to FIGS. 15 and 16 and applicable drawings. That is, FIGS. 15 and 16 are diagrams collectively illustrating an exemplary configuration of an electronic device of this embodiment of present invention. More specifically, FIG. 15 is a plan view illustrating the exemplary configuration of the electronic device of this embodiment of present invention. FIG. 16 is a perspective view also illustrating the electronic device of FIG. 15, which is taken from a point as shown by arrow C in FIG. 15. The mount board tray 30 of this embodiment of the present invention holds the mount board 22 thereon and is pinned to the left and right side frames 15 and 16 of the unit body. At this moment, when the connector 23 engages with the earlier described connector 21, and accordingly positions of the mount board tray 30 and the mount board 22 held by the mount board tray 30 are determined, the mount board tray 30 and the mount board 22 are fixed to the left and right side frames 15 and 16 of the unit body with fastening screws via the fastening holes 34, 35, 36, and 37, respectively. However, in general, when male and female side connectors are engaged with each other thereby determining a position of a mount board, a mounting section around the male and female side connectors need to be highly dimensionally precise resulting in cost increase. Further, when fastening directions are either partially or wholly different from the connector engaging direction of the male and female side connectors in the fastening sections, a position of the mount board is determined based on the different fastening direction, thereby generating misalignment of the male and female side connectors and a load on the connector fitting section resulting in damage and/or defective electrical conduction of the male and female side connectors as well.

In view of the above-described problem, according to the third embodiment of the present invention, all of the fastening holes 34 to 37 are composed of loosely fitting holes, respectively, and all of fastening directions are substantially the same as the connector engaging direction of the connector as shown in FIG. 15. As a result, even when at least one of the fastening holes 34 to 37 deviates from one of the corresponding the tap holes 113, 115, 119, and 121, due to a dimensional variation, such deviation can be allowed as long as a degree of the deviation falls within a range of each of the loosely fitting holes. At the same time, a demand for dimensional precision can be eased thereby capable of reducing the cost therefor as well. In addition, since the mount board tray 30 can be fastened and fixed with the fastening screws in a state that the central axes of the male and female side connectors are align with each other, these male and female side connectors do not generate fitting misalignment when the mount board tray 30 is fastened and fixed to the unit body. Consequently, damage and defective electrical conduction, generally generated by the fitting misalignment of the male and female side connectors, can be prevented at the same time again. Further, since the mount board tray is fastened and fixed with the fastening screws, a problem of misalignment within the range of the fitting hole, which is generally caused by vibration and/or the impact applied to the mount board tray, is hardly raised after fastening thereof.

Further, since positions of the mount board tray and the mount board in the fastening direction (i.e., the connector engaging direction) are determined when the mount board tray is fastened to the unit body, the male and female side connectors can sometimes interfere with each other in the connector engaging direction in the fitting connector section depending on an amount of dimensional variation of these male and female side connectors or the like. Hence, according to this embodiment of the present invention, to solve such a problem, the plate springs 112, 114, 118, and 111 are mounted on the unit body and deform and allow the mount board tray 30 and the mount board 22 to slightly shift in the connector engaging direction. With this, since the misalignment, possibly caused by the interference caused between the male and female side connectors, can be either absorbed or reduced, the load on the male and female side connectors can be accordingly reduced as well. Because a simple configuration is only needed to obtain the above-described various advantages, and is accordingly advantageous in respect of downsizing, cost reduction, and easy assembly of the electronic device as well.

Figure 17:
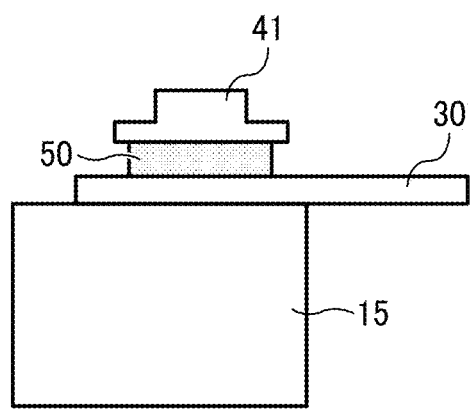
FIG. 17 is a side view partially illustrating an exemplary mount board tray with a fastener and a first exemplary elastic body according to a fourth embodiment of the present invention.
Figure 18:
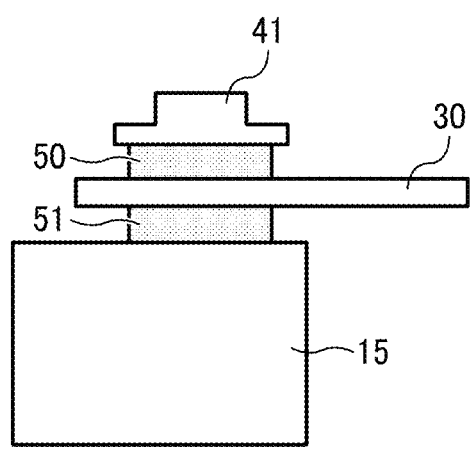
FIG. 18 is also a side view partially illustrating the mount board tray with the fastener and a second exemplary elastic body as a modification of the fourth embodiment of the present invention.

Now, a fourth embodiment of the present invention is herein below described in detail with reference to FIGS. 17 and 18. That is, FIGS. 17 and 18 are diagrams respectively illustrating various exemplary usages of an elastic body according to this embodiment of the present invention. More specifically, FIG. 17 is a side view illustrating a first example using the elastic body according to this embodiment of the present invention. FIG. 18 is also a side view illustrating a second example as a modification of the first example, which also uses an additional elastic body, according to this embodiment of the present invention. As shown in the drawings, these elastic bodies newly employed in this embodiment of the present invention are alternatives of the earlier described plate springs 112, 114, 118, and 111, respectively.

Specifically, as shown in FIG. 17, when the left side frame 15 and the mount board tray 30 are fastened to each other by a fastening screw 41, an elastic body 50 is inserted between the fastening screw 41 and the mount board tray 30. With this, when the male and female side connectors 21 and 23 interfere with each other thereby causing misalignment in the connector engaging direction (i.e., the fastening direction), the elastic body 50 deforms in the same direction thereby allowing the mount board tray 30 to upwardly shift in the drawing, for example. As a result, the misalignment can be allowed while reducing a load on the male and female side connectors 21 and 23.

Further, as shown in FIG. 18, an elastic body 51 is additionally employed in this modification between the left side frame 15 and the mount board tray 30 in addition to the configuration as shown in FIG. 17 (i.e., the elastic body 50). Since the modified configuration is given a locking function to firmly secure the male and female side connectors 21 and 23 to each other, even when a dimension varies and a gap tends to arise between the male and female side connectors 21 and 23 in the connector engaging direction, the mount board tray 30 is pulled downward in the drawing by the locking function of the male and female side connectors 21 and 23 thereby avoiding the gap therebetween. In addition, because the mount board tray 30 can shift downwardly in the drawing due to deformation of the elastic body 51, the load on the connector can be effectively reduced at the same time.

The present invention is not limited to the above-described various embodiments and can include many variants which a person having an ordinary skill in the art can create and accordingly falls within substantially the same technical concept as the present invention.

For example, as the above-described electronic device that implements the mount board and the mount board tray of the present invention, either an electrophotographic apparatus that develops and forms a toner image on a recording medium or an inkjet printer that generates inkjet printings with ink can be employed. As the above-described mount board, either a control mount board that controls image forming operation of the electrophotographic apparatus or the inkjet printer, or a power supply mount board that supplies power or the like can be employed as well.

Although the above-described mount board tray of the various embodiments of the present invention has the step, it can be entirely flat as long as the multiple mount boards are fixed in the similar manner as described in the various embodiments of the present invention.

Further, instead of the above-described cut and bent projections (6a to 6e) and the spacers (60a to 60e), various holders can be used to hold the mount boards 1 and 3. For example, holders (e.g., projections) can be integrally molded together with the mount board tray.

According to one embodiment of the present invention, since more than two mount board three-dimensionally separated from the other is concurrently held by a mount board tray while sufficiently keeping a prescribed distance (i.e., a gap) capable of avoiding a short-circuit between the mount board and the mount board tray, one of noise immunity, grounding property, mount board holding rigidity, and electric shock prevention (herein below simply referred to as a required function) of the mount board can be effectively ensured while downsizing the configuration that holds the mount board and accordingly the electronic device accommodating the mount board as well. That is, according to one embodiment of the present invention, a mount board tray is provided to hold multiple mount boards at different heights above and below the mount board tray. The mount board tray holds a topmost mount board placed at the topmost position among the multiple mount boards held by the mount board tray from below the topmost mount board. The mount board tray also holds a bottommost mount board placed at the bottommost position among the multiple mount boards from above the bottommost mount board at the same time.

According to another embodiment of the present invention, the function required for the mount board can be more effectively ensured while downsizing the configuration that holds the mount board and accordingly the electronic device accommodating the mount board as well. That is, a step is included in the mount board tray at a prescribed position of the mount board tray to define an upper stepped surface on one side of the step and a lower stepped surface on the other side of the step. The lower stepped surface holds the topmost mount board from below the topmost mount board, while the upper stepped surface holds the bottommost mount board from above the bottommost mount board.

According to yet another embodiment of the present invention, the function required for the mount board can be more effectively ensured while downsizing the configuration that holds the mount board and accordingly the electronic device accommodating the mount board as well. That is, a cutaway connector opening is formed in the mount board tray at the prescribed position of the mount board tray to allow a lateral connector to upwardly protrude through the cutaway connector opening without interfering with the mount board tray. The lateral connector is placed on the bottommost mount board to connect the bottommost mount board with the topmost mount board and relatively determine a position of the bottommost mount board regarding the topmost mount board.

According to yet another embodiment of the present invention, the function required for the mount board can be more effectively ensured while downsizing the configuration that holds the mount board and accordingly the electronic device accommodating the mount board as well. That is, the topmost mount board and the bottommost mount board are separated from the lower stepped surface and the upper stepped surface, respectively, of the mount board tray by a length of about 7 millimeter effective to prevent a short circuit between the topmost mount board and the lower stepped surface and the bottommost mount board and the upper stepped surface.

According to yet another embodiment of the present invention, the function required for the mount board can be more effectively ensured while downsizing the configuration that holds the mount board and accordingly the electronic device accommodating the mount board as well. That is, each of the multiple mount boards supports surface mounted components thereon. The upper stepped surface of the mount board tray has a cutaway components opening at a portion above the surface mounted components mounted on the bottommost mount board to allow the surface mounted components of the bottommost mount board to protrude through the cutaway components opening without interfering with the upper stepped surface of the mount board tray.

According to yet another embodiment of the present invention, the function required for the mount board can be more effectively ensured while downsizing the configuration that holds the mount board and accordingly the electronic device accommodating the mount board as well. That is, a first fastening screw is provided to fasten the topmost mount board to the lower stepped surface of the mount board tray from above the topmost mount board. A second fastening screw is also provided to fasten the bottommost mount board to the upper stepped surface of the mount board tray from below the bottommost mount board.

According to yet another embodiment of the present invention, the function required for the mount board can be more effectively ensured while downsizing the configuration that holds the mount board and accordingly the electronic device accommodating the mount board as well. That is, multiple spacers are provided and the first fastening screw fastens the topmost mount board to the lower stepped surface of the mount board tray via one of the multiple spacers. The second fastening screw fastens the bottommost mount board to the upper stepped surface of the mount board tray via another one of the multiple spacers.

According to yet another embodiment of the present invention, the function required for the mount board can be more effectively ensured while downsizing the configuration that holds the mount board and accordingly the electronic device accommodating the mount board as well. That is, a vertical layout of the mount board tray consists of three regions defined by a region in which a surface mounted component is disposed on the topmost mount board fastened to the lower stepped surface of the mount board tray, a distance between the topmost mount board and the bottommost mount board, and a gap between the bottommost mount board and a surface mounted component mounted on a mount board of the other mount board tray disposed right below the bottommost mount board. The distance between the topmost mount board and the bottommost mount board includes a distance between the topmost mount board and the lower stepped surface of the mount board tray and a distance between the bottommost mount board and the upper stepped surface of the mount board tray.

According to yet another embodiment of the present invention, the function required for the mount board can be more effectively ensured while downsizing the configuration that holds the mount board and accordingly the electronic device accommodating the mount board as well. That is, the gap between the bottommost mount board and the surface mounted component mounted on the mount board of the other mount board tray substantially equal to a height of a screw head of the second fastening screw to fasten the bottommost mount board to the upper stepped surface of the mount board tray from below the bottommost mount board.

According to yet another embodiment of the present invention, the function required for the mount board can be more effectively ensured while downsizing the configuration that holds the mount board and accordingly the electronic device accommodating the mount board as well. That is, at least one mount board holding projection is provided to extend from a mount board holding surface of the upper stepped surface of the mount board tray to contact and directly hold the bottommost mount board. The at least one mount board holding projection has a prescribed length effective to prevent a short circuit between the upper stepped surface of the mount board tray and the bottommost mount board.

According to yet another embodiment of the present invention, the function required for the mount board can be more effectively ensured while downsizing the configuration that holds the mount board and accordingly the electronic device accommodating the mount board as well. That is, the at least one mount board holding projection is composed of a partially cut and bent portion of the mount board tray.

According to yet another embodiment of the present invention, the function required for the mount board can be more effectively ensured while downsizing the configuration that holds the mount board and accordingly the electronic device accommodating the mount board as well. That is, at least one mount board holding projection is provided to extend from the lower stepped surface of the mount board tray to contact and directly hold the topmost mount board. The at least one mount board holding projection has a prescribed length effective to prevent a short-circuit between the lower stepped surface of the mount board tray and the topmost mount board. The upper stepped surface has a mount board holding portion near the lateral connector to hold the topmost mount board from below the topmost mount board together with the at least one mount board holding projection extending from the lower stepped surface of the mount board tray.

According to yet another embodiment of the present invention, the function required for the mount board can be more effectively ensured while downsizing the configuration that holds the mount board and accordingly the electronic device accommodating the mount board as well. That is, the mount board holding portion of the upper stepped surface and the at least one mount board holding projection have fastening holes, respectively, used to fasten the topmost mount board to the lower stepped surface of the mount board tray with fasteners.

Numerous additional modifications and variations of the present invention are possible in light of the above teachings. It is therefore to be understood that within the scope of the appended claims, the present invention may be executed otherwise than as specifically described herein. For example, the mount board tray is not limited to the above-described various embodiments and modifications may be altered as appropriate. Further, the electronic device is not limited to the above-described various embodiments and modifications may be altered as appropriate.

What is claimed is:

1. A mount board tray configured to hold multiple mount boards at different heights above and below the mount board tray, the mount board tray being configured to hold a topmost mount board, of the multiple mount boards, placed at a relatively topmost position among the multiple mount boards when held by the mount board tray, and a bottommost mount board, of the multiple mount boards, placed at a relatively bottommost position among the multiple mount boards, the mount board tray comprising:
   a step at a defined position of the mount board tray that defines a relatively upper stepped surface on one side of the step and a relatively lower stepped surface on another side of the step, the relatively lower stepped surface being configured to hold the topmost mount board from below the topmost mount board, and the relatively upper stepped surface being configured to hold the bottommost mount board from above the bottommost mount board; and
   a cutaway connector, opening in the mount board tray at the defined position of the mount board tray, to allow a lateral connector to upwardly protrude through the cutaway connector opening without interfering with the mount board tray, the lateral connector being configured to be placed on the bottommost mount board to connect the bottommost mount board with the topmost mount board and to relatively determine a relative position of the bottommost mount board with respect to the topmost mount board.

2. The mount board tray according to claim 1, wherein the topmost mount board and the bottommost mount board are separated from the lower stepped surface and the upper stepped surface, respectively, of the mount board tray by a length of about 7 millimeter, effective to prevent a short circuit between the topmost mount board and the lower stepped surface, and between the bottommost mount board and the upper stepped surface.

3. An electronic device comprising:
   a unit body; and
   the mount board tray according to claim 1,
   wherein at least two mount boards are connected in the unit body, each of the at least two mount boards holding at least one surface mounted component thereon.

4. The electronic device according to claim 3,
   wherein the electronic device is one of an electrophotographic apparatus and an ink-jet printer, and
   wherein the mount board is one of a control mount board to control the one of the electrophotographic apparatus and the ink-jet printer and a power supply board to supply power.

5. A mount board tray configured to hold multiple mount boards at different heights above and below the mount board tray, the mount board tray being configured to hold a topmost mount board, of the multiple mount boards, placed at a relatively topmost position among the multiple mount boards when held by the mount board tray, and a bottommost mount board, of the multiple mount boards, placed at a relatively bottommost position among the multiple mount boards, the mount board tray comprising:
   a step at a defined position of the mount board tray that defines a relatively upper stepped surface on one side of the step and a relatively lower stepped surface on another side of the step, the relatively lower stepped surface being configured to hold the topmost mount board from below the topmost mount board, and the relatively upper stepped surface being configured to hold the bottommost mount board from above the bottommost mount board,
   wherein each of the multiple mount boards supports surface mounted components thereon, and
   wherein the relatively upper stepped surface of the mount board tray has includes a cutaway components opening at a portion above the surface mounted components mounted on the bottommost mount board to allow the surface mounted components of the bottommost mount board to protrude through the cutaway components opening without interfering with the upper stepped surface of the mount board tray.

6. An electronic device comprising:
   a unit body; and
   the mount board tray according to claim 5,
   wherein at least two mount boards are connected in the unit body, each of the at least two mount boards holding at least one surface mounted component thereon.

7. The electronic device according to claim 6,
   wherein the electronic device is one of an electrophotographic apparatus and an ink-jet printer, and
   wherein the mount board is one of a control mount board to control the one of the electrophotographic apparatus and the ink-jet printer and a power supply board to supply power.

8. A mount board tray configured to hold multiple mount boards at different heights above and below the mount board tray, the mount board tray being configured to hold a topmost mount board, of the multiple mount boards, placed at a relatively topmost position among the multiple mount boards when held by the mount board tray, and a bottommost mount board, of the multiple mount boards, placed at a relatively bottommost position among the multiple mount boards, the mount board tray comprising:
- a step at a defined position of the mount board tray that defines a relatively upper stepped surface on one side of the step and a relatively lower stepped surface on another side of the step, the relatively lower stepped surface being configured to hold the topmost mount board from below the topmost mount board, and the relatively upper stepped surface being configured to hold the bottommost mount board from above the bottommost mount board; and
- a first fastening screw to fasten the topmost mount board to the lower stepped surface of the mount board tray from above the topmost mount board; and
- a second fastening screw to fasten the bottommost mount board to the upper stepped surface of the mount board tray from below the bottommost mount board.

9. The mount board tray according to claim 8, further comprising multiple spacers,
- wherein the first fastening screw fastens the topmost mount board to the lower stepped surface of the mount board tray via one of the multiple spacers, and
- wherein the second fastening screw fastens the bottommost mount board to the upper stepped surface of the mount board tray via another one of the multiple spacers.

10. The mount board tray according to claim 8,
- wherein a vertical layout of the mount board tray includes three regions including
- a region in which a surface mounted component is disposed on the topmost mount board fastened to the lower stepped surface of the mount board tray,
- a distance between the topmost mount board and the bottommost mount board, and
- a gap between the bottommost mount board and a surface mounted component mounted on a mount board of the other mount board tray disposed right below the bottommost mount board, and
- wherein the distance between the topmost mount board and the bottommost mount board includes a distance between the topmost mount board and the lower stepped surface of the mount board tray and a distance between the bottommost mount board and the upper stepped surface of the mount board tray.

11. The mount board tray according to claim 10,
- wherein the gap between the bottommost mount board and the surface mounted component mounted on the mount board of said another mount board tray substantially equal to a height of a screw head of the second fastening screw to fasten the bottommost mount board to the upper stepped surface of the mount board tray from below the bottommost mount board.

12. The mount board tray according to claim 8, further comprising:
- at least one mount board holding projection extending from a mount board holding surface of the upper stepped surface of the mount board tray to contact and directly hold the bottommost mount board,
- wherein the at least one mount board holding projection includes a length effective to prevent a short circuit between the upper stepped surface of the mount board tray and the bottommost mount board.

13. The mount board tray according to claim 12,
- wherein the at least one mount board holding projection is a partially cut and bent portion of the mount board tray.

14. The mount board tray according to claim 12, further comprising:
- at least one mount board holding projection extending from the lower stepped surface of the mount board tray to contact and directly hold the topmost mount board, the at least one mount board holding projection including a length effective to prevent a short-circuit between the lower stepped surface of the mount board tray and the topmost mount board,
- wherein the upper stepped surface includes a mount board holding portion, proximate to the lateral connector, to hold the topmost mount board from below the topmost mount board together with the at least one mount board holding projection extending from the lower stepped surface of the mount board tray.

15. The mount board tray according to claim 14,
- wherein the mount board holding portion of the upper stepped surface and the at least one mount board holding projection each respectively include fastening holes, to fasten the topmost mount board to the lower stepped surface of the mount board tray with fasteners.

16. An electronic device comprising:
a unit body; and
the mount board tray according to claim 8,
wherein at least two mount boards are connected in the unit body, each of the at least two mount boards holding at least one surface mounted component thereon.

17. The electronic device according to claim 16,
- wherein the electronic device is one of an electrophotographic apparatus and an ink-jet printer, and
- wherein the mount board is one of a control mount board to control the one of the electrophotographic apparatus and the ink-jet printer and a power supply board to supply power.

* * * * *